US012581788B2

(12) United States Patent
Nam et al.

(10) Patent No.: US 12,581,788 B2
(45) Date of Patent: Mar. 17, 2026

(54) SOLAR CELL AND SOLAR CELL MODULE INCLUDING THE SAME

(71) Applicant: SHANGRAO XINYUAN YUEDONG TECHNOLOGY DEVELOPMENT CO., LTD., Jiangxi (CN)

(72) Inventors: Jeongbeom Nam, Geumchun-gu Seoul (KR); Ilhyoung Jung, Geumchun-gu Seoul (KR); Kyoungsoo Lee, Geumchun-gu Seoul (KR)

(73) Assignee: SHANGRAO XINYUAN YUEDONG TECHNOLOGY DEVELOPMENT CO. LTD, Jiangxi (CN)

( * ) Notice: Subject to any disclaimer, the term of this patent is extended or adjusted under 35 U.S.C. 154(b) by 138 days.

(21) Appl. No.: 18/241,814

(22) Filed: Sep. 1, 2023

(65) Prior Publication Data

US 2024/0032314 A1      Jan. 25, 2024

Related U.S. Application Data

(63) Continuation of application No. PCT/KR2022/002523, filed on Feb. 21, 2022.

(30) Foreign Application Priority Data

Mar. 2, 2021      (KR) ........................ 10-2021-0027224

(51) Int. Cl.
H10K 30/40          (2023.01)
H10K 30/57          (2023.01)
(Continued)

(52) U.S. Cl.
CPC ............ H10K 30/40 (2023.02); H10K 30/57 (2023.02); H10K 30/83 (2023.02); H10K 39/15 (2023.02); H10K 39/18 (2023.02); H10K 85/50 (2023.02)

(58) Field of Classification Search
None
See application file for complete search history.

(56) References Cited

U.S. PATENT DOCUMENTS

2016/0190377 A1      6/2016   Green
2018/0019358 A1 *    1/2018   Ahn ...................... H10F 77/311
(Continued)

FOREIGN PATENT DOCUMENTS

CN          111430384 A        7/2020
EP          3660927 A1 †    6/2020
(Continued)

OTHER PUBLICATIONS

International Search Report of PCT/KR2022/002523 dated Jun. 14, 2022 in 16 pages.
(Continued)

*Primary Examiner* — Daniel P Malley, Jr.
(74) *Attorney, Agent, or Firm* — Tucker Ellis LLP

(57)          ABSTRACT

A solar cell includes a first photoelectric conversion part, a second photoelectric conversion part, a first electrode, and a second electrode. The first photoelectric conversion part includes a photoelectric conversion layer containing a perovskite compound, a first transport layer, and a second transport layer. The second photoelectric conversion part is arranged below the second transport layer of the first photoelectric conversion part and has a different material or structure from the first photoelectric conversion part. The first electrode is electrically connected to the first photoelectric conversion part on one surface of the first photoelectric conversion part, and the second electrode is electrically connected to the second photoelectric conversion part below the second photoelectric conversion part. The first electrode has a stacking structure of at least two layers, and the second electrode is formed as a single layer.

6 Claims, 13 Drawing Sheets

(51) Int. Cl.

| | |
|---|---|
| *H10K 30/83* | (2023.01) |
| *H10K 39/15* | (2023.01) |
| *H10K 39/18* | (2023.01) |
| *H10K 85/50* | (2023.01) |

(56)                    References Cited

U.S. PATENT DOCUMENTS

| | | | |
|---|---|---|---|
| 2018/0019360 A1* | 1/2018 | Mishima | H10F 77/122 |
| 2022/0102659 A1* | 3/2022 | Kamino | H10K 30/80 |
| 2022/0278290 A1* | 9/2022 | Sebastien | H10K 30/10 |

FOREIGN PATENT DOCUMENTS

| | | | | |
|---|---|---|---|---|
| EP | 3764406 | A1 | | 1/2021 |
| JP | 2018011058 | A | | 1/2018 |
| JP | 2018093168 | A | | 6/2018 |
| JP | 2020092267 | A | | 6/2020 |
| KR | 2011-0004897 | A | | 1/2011 |
| KR | 20120022008 | A | | 3/2012 |
| KR | 2015-0124413 | A | | 11/2015 |
| KR | 2017-0002967 | A | | 1/2017 |
| KR | 20180007585 | A | | 1/2018 |
| KR | 20180011832 | A | | 2/2018 |
| KR | 20180063866 | A | | 6/2018 |
| KR | 10-2018-0099577 | A | | 9/2018 |
| KR | 10-2019-0052981 | A | † | 5/2019 |
| KR | 20190052981 | A | | 5/2019 |
| KR | 10-2019-0136445 | A | † | 12/2019 |
| KR | 20190136445 | A | | 12/2019 |
| KR | 10-2020-0036780 | A | † | 4/2020 |
| KR | 20200036780 | A | | 4/2020 |
| KR | 2021-0013311 | A | | 2/2021 |
| WO | 2014185537 | A1 | | 11/2014 |
| WO | 2016157979 | A1 | | 10/2016 |

OTHER PUBLICATIONS

Japanese Office Action from corresponding Application No. 2023-553259 mailed on Aug. 26, 2024, 18 pages with translation.

Australian Office Action from corresponding Application No. 2022230519 mailed on Jul. 4, 2024, 6 pages.

Mailoa, Jonathan, et al., "A 2-terminal perovskite/silicon multijunction solar cell enabled by a silicon tunnel junction", Applied Physics Letter, Mar. 2015, 5 pages.

Saliba, Michael, et al., "Monolithic Perovskite/Silicon-Heterojunction Tandem Solar Cells Processed at Low Temperature", ResearchGate, Energy &Environmental Science, Nov. 2015, 9 pages.

Chandler, David L., "New kind of "tandem" solar cell developed", MIT News, Mar. 2015, 3 pages.

Japanese Office Action from corresponding Application No. 2023-553259 mailed on Jan. 10, 2025, 8 pages with translation.

Korean Notice of Allowance from corresponding Application No. 10-2021-0027224 mailed on Mar. 24, 2025, 10 pages with translation.

Third Party Observation from corresponding Application No. 22763518.2 mailed on Jan. 21. 2025, 46 pages.

* cited by examiner

† cited by third party

SOLAR CELL AND SOLAR CELL MODULE INCLUDING THE SAME

CROSS-REFERENCE TO RELATED APPLICATIONS

This is a continuation of International Application No. PCT/KR 2022/002523, filed on Feb. 21, 2022, which claims priority to Korean Patent Application No. 10-2021-0027224 filed in the Republic of Korea on Mar. 2, 2021, both of which are hereby expressly incorporated by reference into the present application.

TECHNICAL FIELD

The present disclosure relates to a solar cell and a solar cell module, and more particularly, to a solar cell module including a perovskite structure.

BACKGROUND

A solar cell including a semiconductor substrate may have excellent photoelectric conversion efficiency and thus is widely used. However, the solar cell including the semiconductor substrate has certain limitations in improving the photoelectric conversion efficiency, so solar cells having a variety of structures have been proposed.

As an example, a solar cell including a perovskite compound that absorbs short-wavelength light to perform photoelectric conversion using the short-wavelength light is proposed. However, when a photoelectric conversion layer is formed from this perovskite compound, a perovskite compound layer is formed by combination reaction of an organic material and an inorganic material.

In Korean Laid-Open Patent Publication No. 10-2018-0099577 (published on Sep. 5, 2018), in a method for forming the perovskite compound layer as described above, the organic material and the inorganic material are mixed to prepare a perovskite solution, and then the perovskite solution is coated on a substrate to form the perovskite compound layer.

For a perovskite solar cell formed as described above, a perovskite layer formed on a glass substrate is generally micro-modularized by a unit cell isolation process.

In this regard, to manufacture the perovskite solar cell with a large area, a technology of modularizing a plurality of large-area perovskites into one module is required.

RELATED ART REFERENCES

Korean Laid-Open Patent Publication No. 10-2018-0099577 (published on Sep. 5, 2018)

SUMMARY

The solar cell according to some embodiments of the present disclosure includes a first photoelectric conversion part, a second photoelectric conversion part, a first electrode, and a second electrode. The first photoelectric conversion part includes a photoelectric conversion layer including a perovskite compound, a first transport layer on one side of the photoelectric conversion layer, and a second transport layer on the other side of the photoelectric conversion layer. The second photoelectric conversion part is arranged below the second transport layer of the first photoelectric conversion part and has a different material or structure from the first photoelectric conversion part. The first electrode is electrically connected to the first photoelectric conversion part on one surface of the first photoelectric conversion part that is a light-receiving surface. The second electrode is electrically connected to a bottom of the second photoelectric conversion part. The first electrode has a stacking structure of at least two layers, and the second electrode is formed into a single layer.

The first electrode may include a first conductive layer formed by deposition and a second conductive layer formed by printing and firing a paste on the first conductive layer.

The second electrode may be formed simultaneously with the first conductive layer of the first electrode.

The second electrode may be entirely formed at the bottom of the second photoelectric conversion part.

The second electrode may be formed simultaneously with the second conductive layer of the first electrode.

The second electrode may be patterned at the bottom of the second photoelectric conversion part.

The solar cell may include an overlapping part overlapping with an adjacent solar cell in an edge region, the overlapping part may include an electrode portion connected to the first electrode, and the electrode portion may be formed simultaneously with the first conductive layer of the first electrode.

In addition, the solar cell module according to the present disclosure includes a plurality of solar cells and a connection member connected between adjacent solar cells. Each of the solar cells includes: a first photoelectric conversion part, a second photoelectric conversion part, a first electrode, and a second electrode. The first photoelectric conversion part includes a photoelectric conversion layer including a perovskite compound, a first transport layer on one side of the photoelectric conversion layer, and a second transport layer on the other side of the photoelectric conversion layer. The second photoelectric conversion part is below the second transport layer of the first photoelectric conversion part and has a larger area than the first photoelectric conversion part to constitute a step region. The second photoelectric conversion part has a different material or structure from the first photoelectric conversion part. The first electrode is electrically connected to the first photoelectric conversion part on one surface of the first photoelectric conversion part that is a light-receiving surface, and the second electrode is electrically connected to a bottom of the second photoelectric conversion part. The first electrode has a stacking structure of at least two layers, and the second electrode is formed as a single layer.

The connection member may include an electrode portion connected to the first electrode in the step region, and the second electrode of one of the solar cells and the electrode portion of the adjacent solar cell may be electrically connected by overlapping with the adjacent solar cells.

The overlapping part includes a first overlapping part overlapping with an adjacent upper solar cell and a second overlapping part overlapping with an adjacent lower solar cell, and the connection member includes a conductive adhesive portion entirely arranged between step regions of the second overlapping part of the upper solar cell and the first overlapping part of the lower solar cell.

The electrode portion and the conductive adhesive portion may be in contact with each other and electrically connected.

The plurality of solar cells may be arranged apart from each other, and the connection member may include a wiring connecting the first electrode of one solar cell and the second electrode of an adjacent solar cell.

The connection member may further include a conductive adhesive film for connecting the first electrode and the wiring.

DESCRIPTION OF EMBODIMENTS

Figure 1:
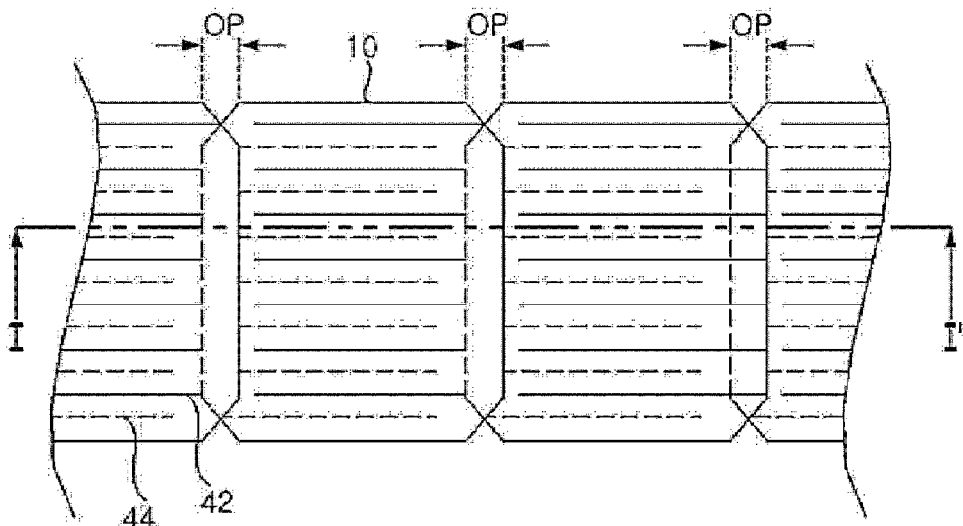
FIG. 1 is a plan view of a solar cell module according to some embodiments of the present disclosure.

Embodiments of the present disclosure will be described in detail below with reference to the accompanying drawings. However, the present disclosure is not limited to such embodiments, and may be modified into various forms.

In order to clearly and briefly explain the present disclosure, illustration of parts irrelevant to the description in the accompanying drawings is omitted, and throughout the specification, same reference signs are used for same or very similar parts. In addition, in order to make the description clearer, the thickness, the width, and the like are enlarged or reduced and shown in the accompanying drawings, and the thickness, the width, and the like in the present disclosure are not limited to those shown in the accompanying drawings.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

A solar cell and a method for manufacturing a solar cell according to some embodiments of the present disclosure will be described in detail below with reference to the accompanying drawings.

In a tandem solar cell module 100 according to some embodiments of the present disclosure, a plurality of tandem solar cells 10 are overlapped and stacked in a stepwise manner, a lower electrode of an upper tandem solar cell 10 and an upper electrode of a lower tandem solar cell 10 adjacent to each other are electrically connected through a conductive adhesive portion 14a and an electrode portion

14b, so that a structure and a manufacturing process can be simplified and light loss can be minimized, thereby maximizing solar cell efficiency.

According to the tandem solar cell module 100 in the present disclosure, the solar cells are arranged to overlap with one another in a stepwise manner, so there is no need to form an interval space between the solar cells for preventing electrical short circuiting and leakage, enabling improvement of the solar cell efficiency according to maximization of a light-receiving area. Moreover, adjacent solar cells are electrically bonded by the conductive adhesive portion 14a and the electrode portion 14b arranged at an overlapping part OP, so the process and the structure are simple, which can be conducive to productivity and manufacturing costs and can also reduce a defect rate in the process.

Characteristic content of the tandem solar cell module 100 and the tandem solar cell 10 according to some embodiments of the present disclosure is described below with reference to the accompanying drawings.

Firstly, the tandem solar cell 10 according to some embodiments of the present disclosure will be described with reference to FIG. 4 to FIG. 6.

Figure 2:
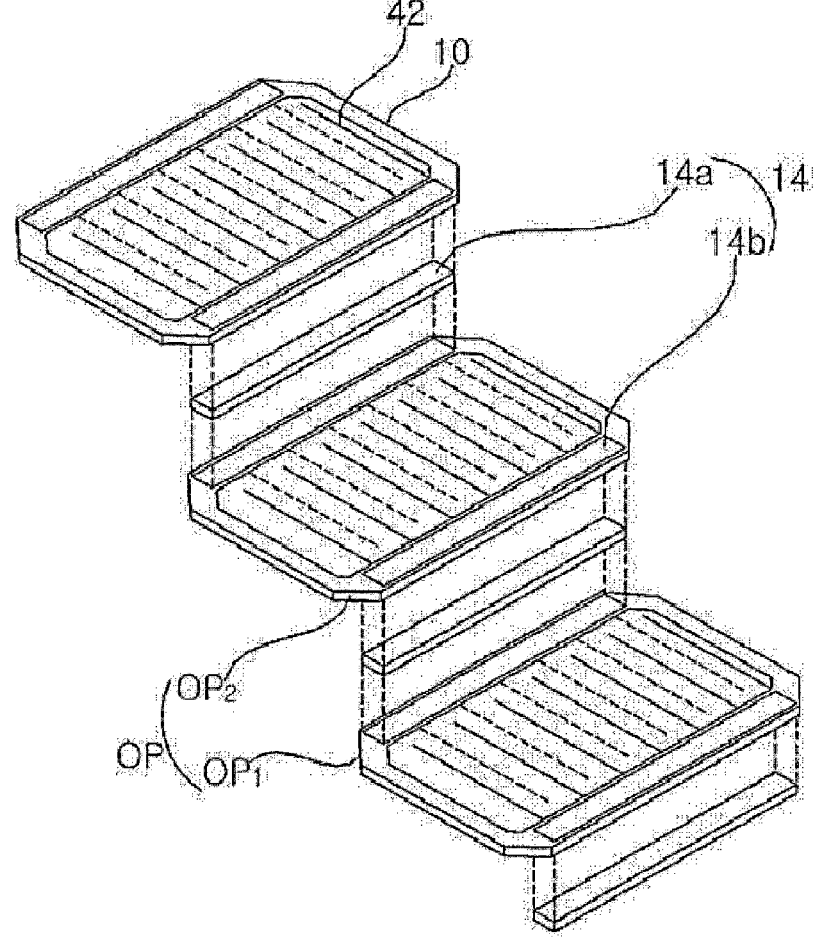
FIG. 2 is an exploded perspective view of the solar cell module shown in FIG. 1.
Figure 4:
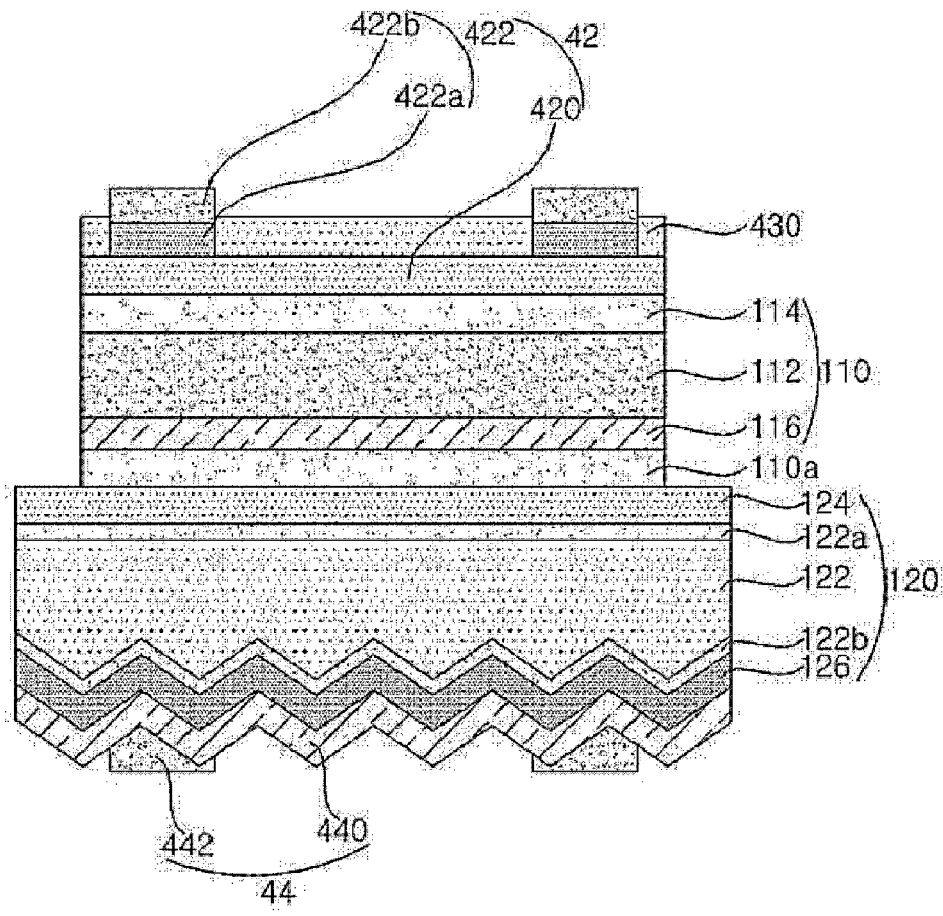
FIG. 4 is a sectional view of a solar cell in the solar cell module shown in FIG. 2 taken along line I-I'.
Figure 5:
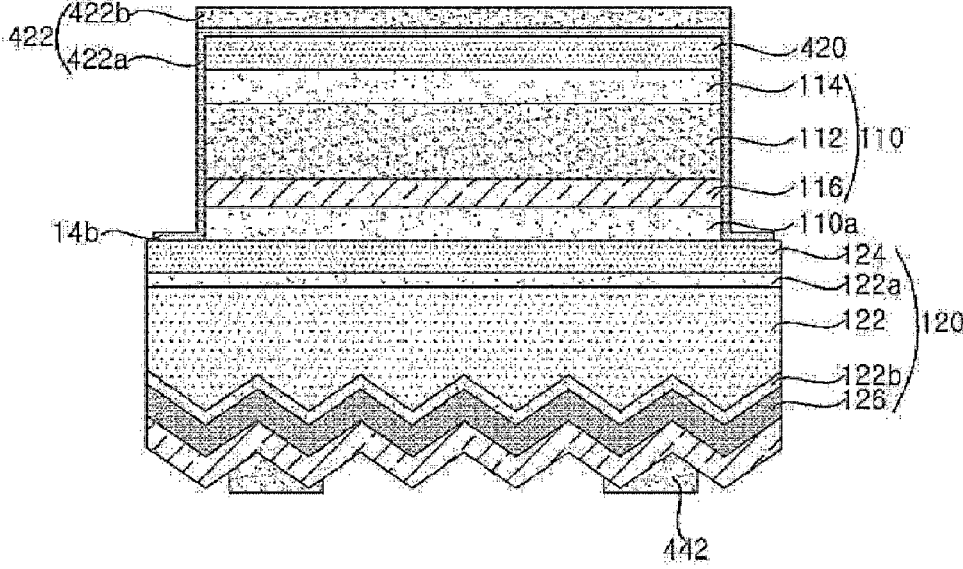
FIG. 5 is a sectional view of a solar cell in the solar cell module shown in FIG. 2 taken along line II-II'.

FIG. 4 is a sectional view of a solar cell in the solar cell module according to some embodiments of the present disclosure, FIG. 5 is a sectional view of a solar cell in the solar cell module shown in FIG. 2 taken along line and FIG. 6 is a rear view of a solar cell in the solar cell module shown in FIG. 2.

One solar cell 10 of the solar cell module 100 according to some embodiments of the present disclosure is the tandem solar cell 10, which may include a first photoelectric conversion part 110 including a photoelectric conversion layer 112 including a perovskite compound, and a first electrode 42 and a second electrode 44 electrically connected thereto. Herein, the photoelectric conversion layer 112 including the perovskite compound may be formed into a thick film having a thickness greater than a predetermined thickness, and may be formed to have a uniform composition in a stacking direction. Moreover, the solar cell 10 according to this embodiment may have a tandem structure further including a second photoelectric conversion part 120 having a different material or structure from the first photoelectric conversion part 110. Moreover, the solar cell 10 according to this embodiment as a large-area solar cell may be formed into a large-area perovskite solar cell 10 with a diameter ranging from 10 cm to 20 cm, preferably ranging from 12 cm to 17 cm.

In the solar cell 10 according to this embodiment, the second photoelectric conversion part 120 may have a pn junction structure including a semiconductor substrate 122. As an example, the second photoelectric conversion part 120 may include a semiconductor substrate 122, and conductive regions 124 and 126 formed in the semiconductor substrate 122 or on the semiconductor substrate 122. The conductive regions 124 and 126 may include a first conductive region 124 having a first conductivity type and a second conductive region 126 having a second conductivity type.

The semiconductor substrate 122 may be composed of a crystalline semiconductor (e.g., a monocrystalline or polycrystalline semiconductor, monocrystalline or polycrystalline silicon as an example) including a single semiconductor material (a Group IV element as an example). Then, based on the semiconductor substrate 122 with high crystallinity and few defects, the second photoelectric conversion part 120 may have excellent electrical properties. As an example, the second photoelectric conversion part 120 may have a crystalline silicon solar cell structure.

In this embodiment, the semiconductor substrate 122 may be doped with a first-conductivity-type dopant or a second-conductivity-type dopant at lower doping concentration than the first conductive region 124 or the second conductive region 126 to form a base region having the first or second conductivity type. That is, the semiconductor substrate 122 may include only the base region without a doping region formed by additionally doping the base region with a dopant.

A first passivation film 122a is formed on a front side of the semiconductor substrate 122, and a second passivation film 122b is formed on a back side of the semiconductor substrate 122.

The first conductive region 124 having the first conductivity type may be formed (e.g., contact) on the first passivation film 122a. Moreover, the second conductive region 126 having the second conductivity type opposite to the first conductivity type may be positioned (e.g., contact) on the second passivation film 122b.

The first conductive region 124 may be a region including a first-conductivity-type dopant and having the first conductivity type. Moreover, the second conductive region 126 may be a region including a second-conductivity-type dopant and having the second conductivity type.

In this embodiment, when the semiconductor substrate 122 (or the base region) has the first conductivity type, the second conductive region 126 may constitute an emitter region forming a pn junction with the semiconductor substrate 122. The first conductive region 124 may constitute a front surface field region that forms a front surface field to prevent recombination. Then, since the emitter region that directly participates in photoelectric conversion is located on the back surface, the emitter region may be formed with a sufficient thickness (formed to be thicker than the front electric field region as an example) to further improve photoelectric conversion efficiency. However, the present disclosure is not limited thereto. Since the semiconductor substrate 122 has the second conductivity type, the first conductive region 124 may also constitute an emitter region, and the second conductive region 126 may also constitute a back surface field region.

In this embodiment, the first conductive region 124 and the semiconductor substrate 122 may have an n type, and the second conductive region 126 may have a p type. Then, in the first photoelectric conversion part 110 located on the second photoelectric conversion part 120, a first transport layer 114 located above may transport electrons, and a second transport layer 116 located below may transport holes. Compared with an opposite case, in this case, the first photoelectric conversion part 110 may bring an excellent effect. In addition, the semiconductor substrate 122 may have an n type, thereby prolonging the life time of the carriers. However, the present disclosure is not limited thereto, and the semiconductor substrate 122 has any one conductivity type of the first conductivity type and the second conductivity type, or has any one conductivity type of the n type and the p type, and may be modified in a variety of manners.

A junction layer (tunneling junction layer) 110a is located on a front surface of the second photoelectric conversion part 120 to connect the second photoelectric conversion part 120 with the first photoelectric conversion part 110 located thereon. Although it is shown in the drawing that the junction layer 110a is in direct contact with the first conductive region 124 and the first photoelectric conversion part 110 respectively, the present disclosure is not limited thereto. The junction layer 110a may have a thin thickness, as an example, a thickness thinner than thicknesses of the first electrode layers 420 and 440, so that the carriers can tunnel smoothly.

The junction layer 110a has an area smaller than that of the second photoelectric conversion part 120, and an area of the first photoelectric conversion part 110 formed thereon is also the same as that of the junction layer 110a.

Therefore, a step is formed around the first photoelectric conversion part 110 due to an area difference between the second photoelectric conversion part 120 and the first photoelectric conversion part 110, thereby forming a step region exposing the lower second photoelectric conversion part 120.

Therefore, the step region as described above may surround the second photoelectric conversion part 120 and be formed in a frame shape, but is not limited thereto, and may be formed only into a side portion formed with a plate.

The junction layer 110a may electrically connect the first photoelectric conversion part 110 with the second photoelectric conversion part 120, and may include a material that can transmit light (long-wavelength light as an example) used in the first photoelectric conversion part 110. As an example, the junction layer 110a may include at least one of a transparent conductive material (transparent conductive oxide as an example), a conductive carbon material, a conductive polymer, and n-type or p-type amorphous silicon. In some other embodiments, the junction layer 110a may be formed into a structure in which silicon layers having different refractive indexes from each other are alternately stacked, while light used in the second photoelectric conversion part 120 (short-wavelength light as an example) can be reflected by the second photoelectric conversion part 120 and light used in the first photoelectric conversion part 110 (long-wavelength light as an example) may be transmitted and supplied to the first photoelectric conversion part 110.

The first photoelectric conversion part 110 including the photoelectric conversion layer 112 including the perovskite compound may be positioned on the junction layer 110a. For example, the first photoelectric conversion part 110 may include a photoelectric conversion layer 112, a second transport layer (second carrier transport layer) 116 on one side of the photoelectric conversion layer 112 and between the junction layer 110a and the photoelectric conversion layer 112, and a first transport layer (first carrier transport layer) 114 on the other side of the photoelectric conversion layer 112 and between the photoelectric conversion layer 112 and the first electrode 42.

The second transport layer 116 located on the junction layer 110a is a layer that extracts and transports second carriers (holes as an example) according to a bandgap relationship with the photoelectric conversion layer 112. As an example, the second carriers transported through the second transport layer 116 may pass through the junction layer 110a and move to the first photoelectric conversion part 110.

The photoelectric conversion layer 112 located on the second transport layer 116 may be formed by a perovskite compound having a perovskite structure, and may be a photoactive layer that can be excited by light and generate carriers (electrons and holes). As an example, the perovskite structure may have a chemical formula of $AMX_3$ (herein, A is a monovalent organic ammonium cation or metal cation; M is a divalent metal cation; X means a halogen anion). This photoelectric conversion layer 112 serves as AMX3, which may include $CH_3NH_3PbI_3$, $CH_3NH_3PbI_xCl_{(3-x)}$, $CH_3NH_3PbI_xBr_{(3-x)}$, $CH_3NH_3PbCl_xBr_{(3-x)}$, $HC(NH_2)_2PbI_3$, $HC(NH_2)_2PbI_xCl_{(3-x)}$, $HC(NH_2)_2PbI_xBr_{(3-x)}$, $HC(NH_2)_2PbCl_xBr_{(3-x)}$, and the like, or may include a compound in which A of $AMX_3$ is partially doped with Cs. However, the present disclosure is not limited thereto, and a variety of materials may be used as the photoelectric conversion layer 112.

The photoelectric conversion layer 112 formed by a perovskite compound may have a thickness greater than the predetermined thickness, and may have a greater thickness than the first conductive region 124.

As an example, the predetermined thickness of the photoelectric conversion layer 112 may be 400 nm to 800 nm or more, but is not limited thereto.

However, when the photoelectric conversion layer 112 is formed into a thick film having a thickness greater than a predetermined thickness dl, photoelectric efficiency can be improved. The photoelectric conversion layer 112, when cut in the stacking direction, may have a perovskite structure from a region in contact with the second transport layer 116 to a region in contact with the first transport layer 114, and the composition of the perovskite compound is maintained in the stacking direction.

Therefore, in a boundary region serving as the region in contact with the first transport layer 114 or the region in contact with the second transport layer 116, a basic material layer for forming the perovskite compound does not remain. Therefore, the problem of carrier blockage caused by the residue of the basic material layer is eliminated, so that a large-area thick film can be formed while the photoelectric efficiency is ensured.

The first transport layer 114 located on the photoelectric conversion layer 112 is a layer that extracts and transports first carriers (electrons as an example) through a bandgap relationship with the photoelectric conversion layer 112.

The first electrode 42 may be located on the first photoelectric conversion part 110 (the first transport layer 114 on the front surface thereof as an example), and the second electrode 44 may be located on the second photoelectric conversion part 120 (the second conductive region 126 on the back surface thereof as an example). That is, the solar cell 10 according to this embodiment may have a tandem structure in which the second photoelectric conversion part 120 based on a single semiconductor material (silicon as an example) is bonded, through the junction layer 110a, to the first photoelectric conversion part 110 based on a perovskite compound.

In this embodiment, the first photoelectric conversion part 110 has a larger bandgap than the second photoelectric conversion part 120. That is, the first photoelectric conversion part 110 has a relatively large bandgap to absorb a short wavelength that is a relatively small wavelength and uses the short wavelength to generate photoelectric conversion, and the second photoelectric conversion part 120 has a bandgap smaller than that of the first photoelectric conversion part 110 to effectively absorb a long wavelength that is a wavelength larger than that of the light used in the first photoelectric conversion part 110 and uses the long wavelength to generate photoelectric conversion.

In more detail, when light passes through the front surface of the solar cell 10 and is incident, the first photoelectric conversion part 110 absorbs short wavelengths to generate electrons and holes through photoelectric conversion. In this case, the first carriers (electrons as an example) move to the first electrode 42 and are collected, and the second carriers (holes as an example) pass through the first photoelectric conversion part 110 and the second photoelectric conversion part 120, move to the second electrode 420, and are collected. When a long wavelength passing through but not used in the first photoelectric conversion part 110 reaches the second photoelectric conversion part 120, the second photoelectric conversion part 120 absorbs the long wavelength and generates electrons and holes through photoelectric conversion. In this case, the first carriers (electrons as an example) move to the first electrode 42 side through the first photoelectric conversion part 110 and are collected, and the second carriers (holes as an example) move to the second electrode 44 side and are collected.

As described above, in this embodiment, since light having various wavelengths can be used in the photoelectric conversion parts 110 and 120, the efficiency of the solar cell can be greatly improved. In particular, in this embodiment, a variety of properties may be improved by including the first photoelectric conversion part 110 based on a perovskite compound and the second photoelectric conversion part 120 having a hetero junction structure. That is, both the first photoelectric conversion part 110 and the second photoelectric conversion part 120 above may be formed in a low-temperature process, and it is easy to adjust a temperature range due to similar process temperatures, so process matching is achieved. In addition, since the first photoelectric conversion part 110 and the second photoelectric conversion part 120 above respectively have an excellent open-circuit voltage, the efficiency of the solar cell 10 with a tandem structure can be greatly improved. A variety of structures are applicable to the second photoelectric conversion part 120, and a variety of other modifications are possible.

In this embodiment, the first photoelectric conversion part 110 may be formed by a low-temperature process (a low-temperature process below 200° C. as an example), a temperature from room temperature to below 150° C. as an example, and in an embodiment, room temperature (a temperature above 20° C. and below 150° C. as an example).

The first electrode 42 may include a first electrode layer 420 and a second electrode layer 422 sequentially stacked on the photoelectric conversion parts 110 and 120. As an example, the first electrode layer 420 may be entirely formed (e.g., in contact with) on the first photoelectric conversion part 110 (for example, the first transport layer 114). The term "entirely formed" includes not only the case where the entire first photoelectric conversion part 110 is covered without leaving an empty space or an empty area, but also the case where a portion of the first photoelectric conversion part 110 is inevitably excluded. As described above, when the first electrode layer 420 is entirely formed on the first conductive region 124, the carriers can easily reach the second electrode layer 422 through the first electrode layer 420, thereby reducing resistance in a horizontal direction.

As described above, the first electrode layer 420 is formed on the entire first photoelectric conversion part 110, and thus may be composed of a material that can transmit light (a light-transmitting material). That is, the first electrode layer 420 is composed of a transparent conductive material to allow the carriers to move easily while enabling transmission of the light. Therefore, the first electrode layer 420 is formed on the entire first photoelectric portion 110 and does not block the transmission of the light. As an example, the first electrode layer 420 may include a transparent conductive material (for example, a transparent conductive oxide, indium tin oxide (ITO) or the like as an example), a carbon nano tube (CNT), and the like. However, the present disclosure is not limited thereto, and the first electrode layer 420 may include a variety of other materials.

The second electrode layer 422 may be formed (e.g., in contact with) on the first electrode layer 420. The second electrode layer 422 may be composed of a material having better electrical conductivity than the first electrode layer 420. Therefore, properties such as carrier collection efficiency and resistance reduction of the second electrode layer 422 can be further improved. As an example, the second electrode layer 422 may be composed of an opaque metal having excellent electrical conductivity, or a metal having lower transparency than the first electrode layer 420.

As described above, the second electrode layer 422 is opaque or has low transparency and hinders incidence of light, and thus may have a predetermined pattern to minimize shading loss. Therefore, light can be incident on a portion where the second electrode layer 422 is not formed.

In this embodiment, the second electrode layer 422 may have a first conductive layer 422a including metal, and a second conductive layer 422b formed at least on the first conductive layer 422a and having a greater density than the first conductive layer 422a.

As an example, the first conductive layer 422a may be formed of an alloy having at least one of Ag, Cu, Al, Mo, Ti, Pd, W, and Pt, and may be formed through a deposition process.

The deposition process for forming the first conductive layer 422a may be vacuum deposition, sputtering, or electroplating.

In this case, the first conductive layer 422a formed by deposition may have a thickness less than 5 μm.

In addition, as shown in FIG. 5, the first conductive layer 422a forms the electrode portion 14b constituting a plate in the step region.

That is, as shown in FIG. 5, the first conductive layer 422a extending above the first photoelectric conversion part 110 is deposited to the step region to form the electrode portion 14b.

In this case, the electrode portion 14b is formed only by the first conductive layer 422a on which the second conductive layer 422b is not formed.

In addition, the second conductive layer 422b may be formed on the first conductive layer 422a without including a glass frit composed of a predetermined metal compound (an oxygen-containing oxide, a carbon-containing carbide, or a sulfur-containing sulfide as an example) and the like, and may include only metal and resin (an adhesive, a curing agent, or an additive). This is to facilitate firing at a low temperature without the glass frit. In this embodiment, since the second electrode layer 422 contacts and is formed on the first electrode layer 420, fire-through through an insulating film or the like is not required. Therefore, a low-temperature fired paste not provided with the glass frit is used. As described above, the second conductive layer 422b is not provided with the glass frit but only provided with resin, so conductive materials can be sintered and not connected to each other but contact each other and aggregate to become conductive. In more detail, the second conductive layer 422b may be formed by firing or curing a paste including a plurality of metal particles and resin. In this embodiment, firing may also be performed at a lower temperature (below 200° C. as an example, below 150° C. in some embodiments) than a temperature used in an existing low-temperature process.

In this case, metal particles of the second conductive layer 422b may include Ag, Cu, and Al, and be formed with a thickness less than 30 μm.

As described above, while the second electrode layer 422 is formed into a double-layer structure, a lower layer is formed by deposition and an upper layer is formed by printing and curing according to a paste, so that contact resistance can be reduced while a characteristic of connection with the lower first electrode layer 420 is improved, and electrical conductivity can also be ensured.

In this embodiment, the specific resistance of the second conductive layer 422b may be less than, equal to, or greater than that of the first conductive layer 422a. Conventionally, a conductive layer located above has a lower resistance than a conductive layer (seed layer) located roughly below. However, in this embodiment, the second conductive layer 422b may be formed by a material having a specific resistance equal to or greater than that of the first conductive layer 422a. This is because the second conductive layer 422b is formed as an auxiliary layer for increasing contact resistance.

The second electrode 44 is located on the second photoelectric conversion part 120, and as shown in FIG. 5, may have a double-layer structure of the first electrode layer 440 and the second electrode layer 442.

A function, a material, a shape, and the like are the same as or similar to those of the first electrode layer 440, so the description can be applied.

Figure 6A:
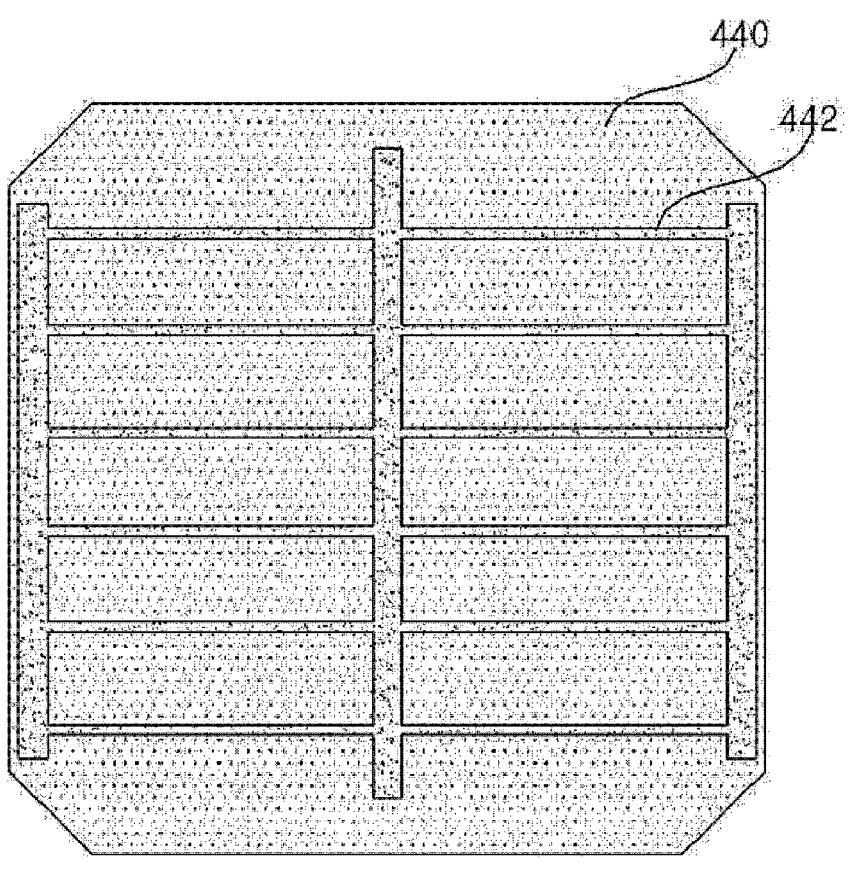
FIGS. 6A-6B are front and rear views of a solar cell in the solar cell module shown in FIG. 2, respectively.
Figures 6B, 7A:
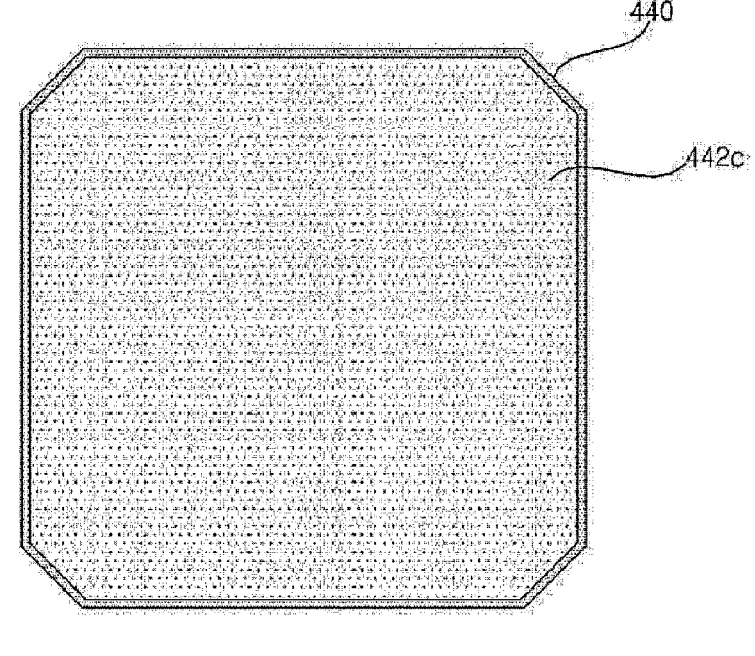
FIGS. 7A-7G are sequence diagrams for manufacturing the solar cell of FIG. 5 and FIGS. 6A-6B.

In addition, the second electrode layer 442 on the first electrode layer 440 may have a structure in FIG. 6a or FIG. 6b.

Referring to FIG. 6a, as shown in FIG. 4 and FIG. 5, different from the first electrode 42, the second electrode layer 442 of the second electrode 44 is formed as a single layer.

In this case, the second electrode layer 442 may be formed into the second conductive layer 422b of the first electrode 42 patterned as shown in FIG. 6a.

A function, a material, a shape, and the like of the second electrode layer 442 are the same as or similar to those of the second conductive layer 442b of the first electrode 42, so the description thereof can be applied.

The above second electrode layers 422 and 442 of the first electrode 42 and the second electrode 44 may have a variety of planar shapes.

As an example, as shown in FIG. 2 and FIG. 6a, the second electrode layer 422 may respectively include a plurality of finger electrodes 42a spaced apart from each other while having a constant pitch, and the second electrode layer 442 may respectively include a plurality of finger electrodes 44a spaced apart from each other while having a constant pitch. Although it is illustrated in the drawing that the finger electrodes 42a and 44a are respectively parallel to each other and parallel to edges of the photoelectric conversion parts 110 and 120 (the semiconductor substrate 122 as an example), the present disclosure is not limited thereto. Moreover, the second electrode layer 422 and 442 may include other finger electrodes formed in a direction crossing the finger electrodes 42a and 44a and connected to the finger electrodes 42a and 44a.

In addition, as shown in FIG. 6b, the second electrode 44 may be formed such that the second electrode layer 442 is composed of only a first conductive layer 442c.

As described above, when the second electrode layer 442 is composed of only the first conductive layer 442c, the first conductive layer 442c is formed in front to cover the entire first electrode layer 440 and is not patterned. The solar cell as described above can be manufactured by a manufacturing method shown in FIG. 7.

Referring to FIG. 7, a method for manufacturing a solar cell 100 according to this embodiment includes: a step of forming a second photoelectric conversion part 120; a step of forming a protective layer (a first electrode layer 440 of a second electrode 44); a step of forming a junction layer 110a; a step of forming a first photoelectric conversion part 110; a step of forming a first electrode layer 420 of a first electrode 42; and a step of forming a second electrode layer 422. Herein, the step of forming a second electrode layer 422 may include: a step of forming a first conductive layer 422a; a step of applying a paste; a step of forming a second conductive layer 422b by firing or curing; and a step of forming the second conductive layer 422b. A more detailed description thereof will be provided.

As shown in FIG. 7a, in the step of forming the second photoelectric conversion part 120, the second photoelectric conversion part 120 including a semiconductor substrate 122, a first conductive region 124, a second conductive region 126, and the like is formed.

Firstly, the semiconductor substrate 122 formed into a base region having a first-conductivity-type dopant or second-conductivity-type dopant is prepared. In this case, at least one of a front surface and a back surface of the semiconductor substrate 122 may be textured to have unevenness to have an antireflection structure. Wet or dry texturing may be used for the texturing of the surface of the semiconductor substrate 122. The wet texturing may be performed by immersing the semiconductor substrate 122 in a texturing solution, and has an advantage of a short process time. In the dry texturing, the surface of the semiconductor substrate 122 is cut using a diamond grill, a laser, or the like, which may uniformly form the unevenness, but may have a long process time and cause damages to the semiconductor substrate 122. In addition, the semiconductor substrate 122 may be textured by reactive ion etching (RIE) or the like. As described above, in the present disclosure, the semiconductor substrate 122 may be textured with various methods.

Next, conductive regions 124 and 126 are formed on the surfaces of the semiconductor substrate 122. For example, a first passivation film and the first conductive region 124 are formed on the front surface of the semiconductor substrate 122, and a second passivation film and the second conductive region 126 are formed on the back surface of the semiconductor substrate 122.

Conductive regions 20 and 30 may be formed by thermal growth, deposition (e.g., chemical vapor deposition (PECVD), atomic layer deposition (ALD)), low-pressure chemical vapor deposition (LPCVD)), or the like. However, the present disclosure is not limited thereto.

The first-conductivity-type dopant or second-conductivity-type dopant may also be included in the process of growing semiconductor layers forming the conductive regions 124 and 126, and the semiconductor layers may be doped by ion implantation, thermal diffusion, laser doping, or the like after formation. However, the present disclosure is not limited thereto, and the conductive regions 124 and 126 may be formed with various methods.

Figure 7B:
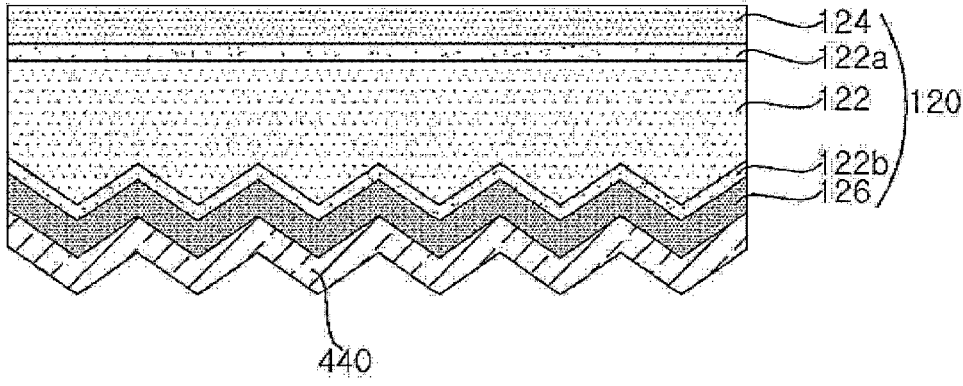

Next, as shown in FIG. 7b, in the step of forming the protective layer (the first electrode layer 440 of the second electrode 44), the protective layer is formed on the second conductive region 126. In this case, in this embodiment, the first electrode layer 440 of the second electrode 44 may be formed as the protective layer on the second conductive region 126. The first electrode layer 440 functions as a protective layer on the second conductive region 126 and protects the second conductive region 126 in the manufacturing process, and may remain as it is to function as the first electrode layer 440. That is, in this embodiment, prior to the formation of the first photoelectric conversion part 110, the first electrode layer 440 of the second electrode 44 is used as the protective layer, thereby simplifying the process. However, the present disclosure is not limited thereto, and a protective layer different from the first electrode layer 440 may be formed separately and the first electrode layer 440 may be formed in a state where the protective layer is removed or not removed.

As an example, the first electrode layer 440 of the second electrode 42 may be formed by sputtering. A sputtering process may be performed at a low temperature, and the first electrode layer 440 of the second electrode 42 may be formed only on a back surface as a single side. However, the present disclosure is not limited thereto, and various methods such as a coating method are applicable.

Figure 7C:
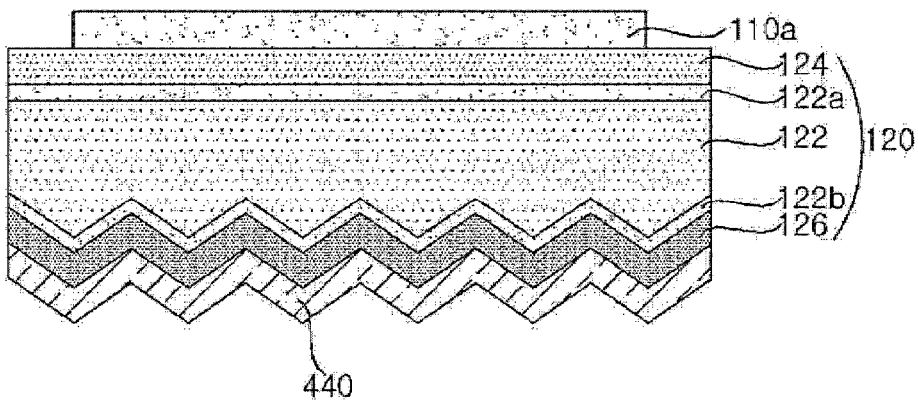

Next, as shown in FIG. 7c, in the step of forming the junction layer 110a, the junction layer 110a may be formed on the second photoelectric conversion part 120. In an embodiment, the junction layer 110a may be formed on a portion of the second photoelectric conversion part 120 where the protective layer is not formed, that is, the first conductive region 124. As an example, the junction layer 110a may be formed by sputtering. A sputtering process may be performed at a low temperature, and as a single-sided process, the junction layer 110a may be formed only on the second conductive region 124. However, the present disclosure is not limited thereto, and various methods such as a coating method are applicable.

Figure 7D:
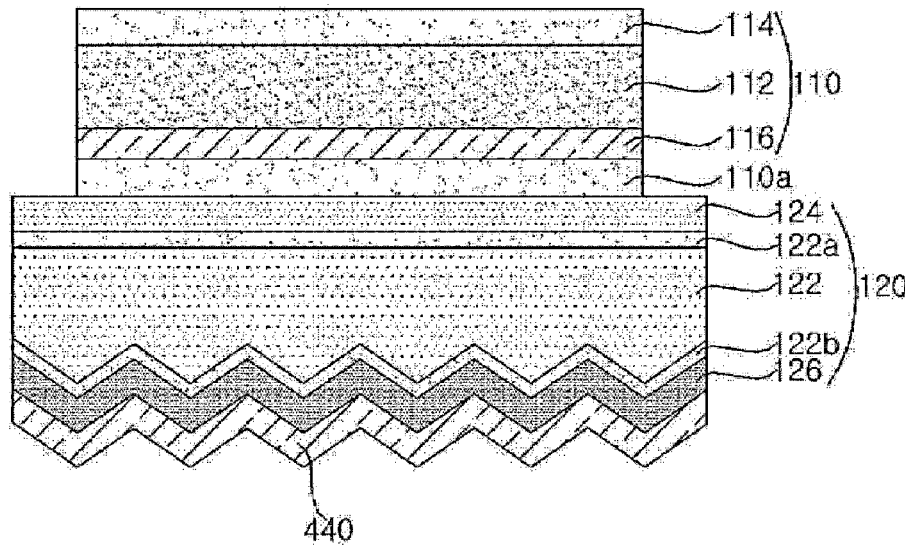

Next, as shown in FIG. 7d, in the step of forming the first photoelectric conversion part 110, the first photoelectric conversion part 110 is formed on the junction layer 110a. In an embodiment, the second transport layer 116, the photoelectric conversion layer 112, and the first transport layer 114 may be sequentially formed on the junction layer 110a.

The second transport layer 116, the photoelectric conversion layer 112, and the first transport layer 114 may be formed with various methods, such as deposition (such as physical deposition or chemical deposition) or printing. Herein, the printing may include inkjet printing, gravure printing, spray coating, doctor blading, bar coating, gravure coating, brush coating, slot-die coating, and the like. However, the present disclosure is not limited thereto.

Figure 7E:
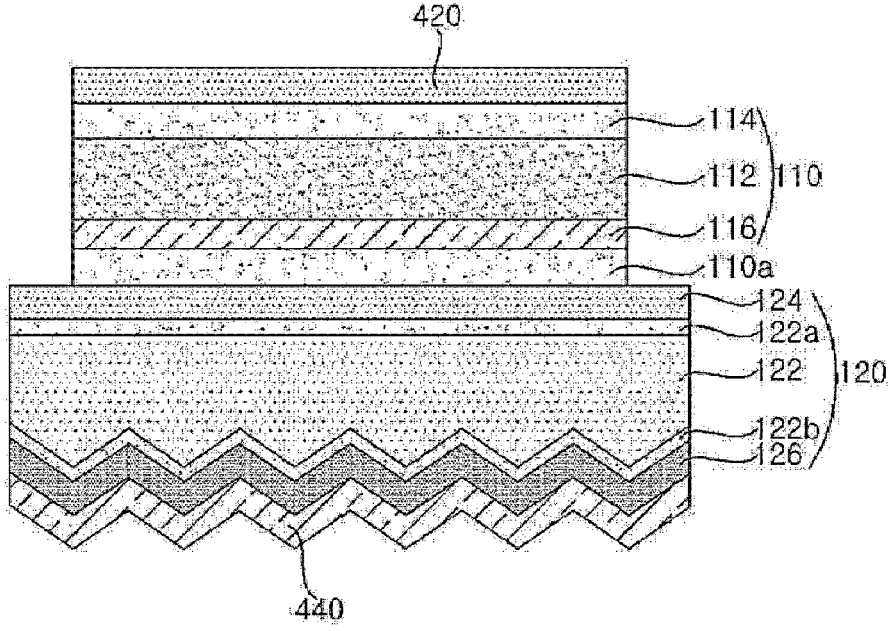

Next, as shown in FIG. 7e, in the step of forming the first electrode layer 420 of the first electrode 42, the first electrode layer 420 of the first electrode 42 may be formed on the first photoelectric conversion part 110. In an embodiment, the first electrode layer 420 of the first electrode 42 may be formed on the first transport layer 114.

As an example, the first electrode layer 420 of the first electrode 42 may be formed by sputtering. A sputtering process may be performed at a low temperature, and the first electrode layer 420 of the first electrode 42 may be formed only on a front surface as a single side. However, the present disclosure is not limited thereto, and various methods such as a coating method are applicable.

Moreover, it is exemplified in this embodiment that the first electrode layer 440 of the second electrode 44 is formed before the first photoelectric conversion part 110 is formed, and the first electrode layer 420 of the first electrode 42 is formed after the first photoelectric conversion part 110 is formed. However, the present disclosure is not limited thereto, and the first electrode layer 440 of the second electrode 44 may be formed after the first photoelectric conversion part 110 is formed. In this case, the first electrode layer 440 of the second electrode 44 may be formed together with the first electrode layer 420 of the first electrode 42, and may be formed before or after the first electrode layer 440 of the first electrode 42 is formed. A variety of other modifications are possible.

Figure 7F:
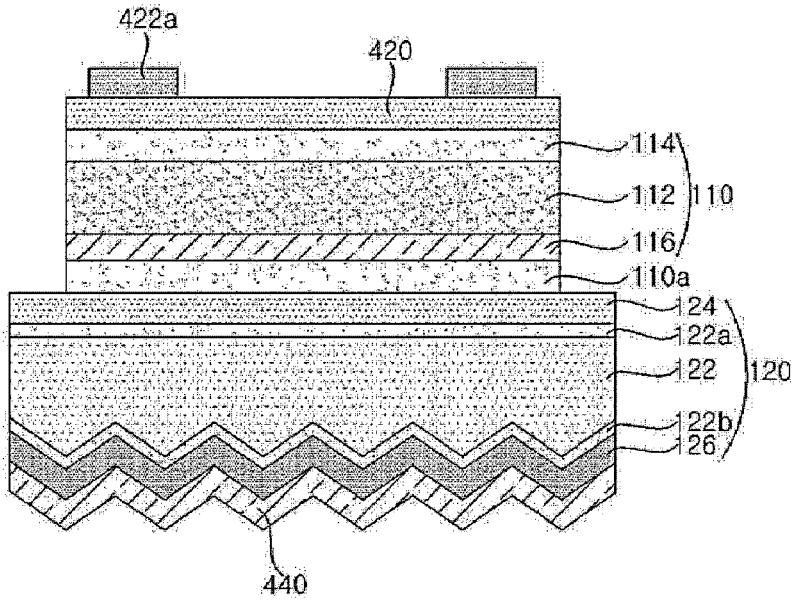
Figure 7G:
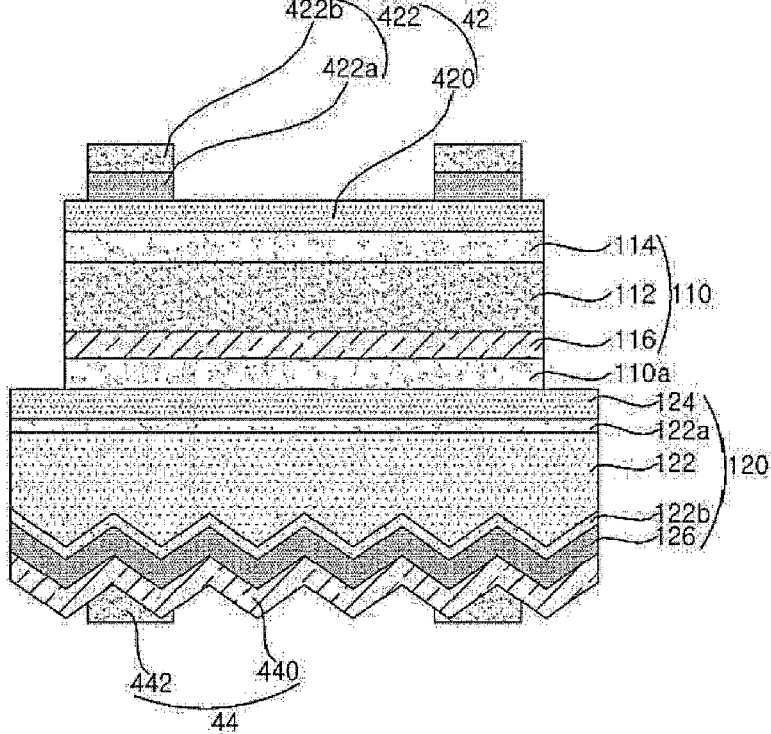

Next, as shown in FIG. 7*f* to FIG. 7*g*, in the step of forming the second electrode layer 422, the second electrode layers 422 and 442 of the first electrode 42 and the second electrode 44 are formed. In the following, the second electrode layer 422 of the first electrode 42 is provided with a first conductive layer 422*a* and a second conductive layer 422*b*, and the second electrode layer 442 of the second electrode 44 is formed into a single layer provided with the first conductive layer 422*a* or the second conductive layer 422*b*.

In this case, the first conductive layers 422*a* of the first electrode 42 and the second electrode 44 are formed simultaneously if the second electrode layer 442 of the second electrode 44 is composed of the first conductive layer 422*a*, and the second conductive layers 422*b* of the first electrode 42 and the second electrode 44 are formed simultaneously and fired simultaneously if the second electrode layer 442 of the second electrode 44 is composed of the second conductive layer 422*b*.

Firstly, as shown in FIG. 7*f*, in order to form the first conductive layer of the second electrode layer of the first electrode, the first conductive layer is formed by a deposition process.

In this case, as a deposition process, sputtering, vacuum deposition, or coating (electroplating) is applicable in various manners.

As an example, when a sputtering layer is formed by sputtering, a temperature in a process of forming the second electrode layer 422 may be lower than 150° C. (100° C. to 145° C. as an example). The second electrode layer 422 may be formed by sputtering in a state where a mask or mask layer is provided, so that the second electrode layers 422 and 442 have desired patterns. In addition, the second electrode layer 422 may also include an additional conductive layer formed by sputtering or electroplating (electrolytic plating as an example) on the sputtering layer formed by sputtering. In addition, the second electrode layers 422 and 442 of the first electrode 42 and the second electrode 44 according to this embodiment may be formed by various processes performed below 150° C.

In this case, as shown in FIG. 6*b*, the second electrode layer of the second electrode, when formed by the first conductive layer, can be formed by a same deposition process as the first conductive layer of the first electrode.

Next, the second conductive layer is formed on the first conductive layer of the first electrode.

For the second conductive layer, the first electrode layer 420 of the first electrode 42 is coated with a first paste, and when the second electrode is patterned as shown in FIG. 6*a*, the first electrode layer 440 of the second electrode 44 is coated with a second paste. The first paste and the second paste may include a plurality of metal particles MP, resin RS, and a solvent S, respectively. The resin RS may include a cellulose-based or phenol-based adhesive, an amine-based curing agent, and the like. As the solvent S, various materials may be used, and as an example, an ether-based solvent may be used. In addition, a variety of additives, dispersants, and the like may be further included.

In this case, the first paste and the second paste may have a same material, composition, or thickness as each other, and the first paste and the second paste may have different materials, compositions, or thicknesses from each other.

The first paste or the second paste may be formed by printing (screen printing or inkjet printing as an example), so the process may be performed at room temperature. Therefore, the first paste or the second paste is suitable for a low-temperature process. In addition, the first paste or the second paste is formed to be thin and high, so as to achieve a fine line width by increasing an aspect ratio.

Next, the first paste and the second paste are fired or cured by firing or hardening, so as to form the second conductive layers 422*b* of the first electrode 42 and the second electrode 44. The above firing or curing process may be performed by thermal curing that provides heat, ultraviolet curing that provides ultraviolet light, or the like. It is exemplified in this embodiment that the first paste and the second paste are co-fired to simplify the process, but the present disclosure is not limited thereto.

In this firing or curing process, the volume of the paste is reduced and the solvent S is removed, resulting a shrink phenomenon, so that the plurality of metal particles MP are connected to each other or connected via the resin RS. In this case, in this embodiment, the firing or curing process is performed at a temperature lower than a curing temperature of the resin. For example, the hardening temperature of the resin exceeds 150° C., and in this embodiment, a firing or curing temperature may be below 150° C. (e.g., 120° C. to 145° C.). When the firing or curing temperature exceeds 150° C., the perovskite compound deteriorates, and it may be difficult to perform photoelectric conversion according to the first photoelectric conversion part 110 or the first photoelectric conversion part 110 cannot have sufficient properties. When the firing or curing temperature is lower than 120° C., the paste is hardly fired, so electrical properties may be degraded.

In this embodiment, a specific process for forming the first electrode 42 and the second electrode 44 at a low temperature (i.e., below 150° C.) is proposed in the solar cell 100 provided with the first photoelectric conversion part 110 including a perovskite compound. That is, after the first conductive layer is formed by a deposition process, an electrode layer is formed thereon as a second conductive layer by printing, so that a filling rate and excellent efficiency and reliability can be ensured.

In addition, as described above, the tandem solar cell 10 according to this embodiment may include an overlapping part OP in opposite step regions, and the electrode portion 14*b* is formed as a plate in the overlapping part OP.

In an embodiment, the overlapping part OP forms the tandem solar cell module 100 to be described later, so that when adjacent tandem solar cells 10 are superimposed, the tandem solar cell 10 corresponding to the overlapping section is a step area of the tandem solar cell 10. Each of the tandem solar cells 10 may include a first overlapping part OP1 overlapping with an adjacent upper tandem solar cell 10 and a second overlapping part OP2 overlapping with an adjacent lower tandem solar cell 10.

For example, as long as a plurality of tandem solar cells 10 are cascaded and stacked in a stepwise manner in an arrangement direction, a specific one tandem solar cell 10 overlaps with the adjacent upper tandem solar cell 10 and the adjacent lower tandem solar cell and includes a first overlapping part OP1 and a second overlapping part OP2, and the first overlapping part OP1 and the second overlapping part OP2 are respectively arranged in the step regions on two sides of the tandem solar cell 10 and are opposite to each other in the arrangement direction.

The overlapping part OP according to this embodiment may be in a shape of a rectangle, a geometric polygon, or the like according to a shape of the tandem solar cell 10. However, the shape of the overlapping part OP is not limited to the description or the drawings, and may include a range to which a person of ordinary skill in the art can easily design and change the shape of the overlapping part. A width of the step region may exceed about 1 mm and less than about 15 mm, and in an embodiment, may exceed about 1 mm and less than about 5 mm.

In this embodiment, the width of the step region is kept in the above range, so that, when the tandem solar cell module 100 is formed later, a large light-receiving area can be ensured while stable modularization can be performed, thereby producing excellent output of the solar cell. When a width of the overlapping part OP is less than 1 mm, bonding stability of adjacent tandem solar cells 10 may be reduced during the modularization. When the width of the overlapping part OP exceeds 15 mm, the light-receiving area of the tandem solar cell 10 is excessively reduced, which may reduce the output of the solar cell.

The widths of the first overlapping part OP1 and the second overlapping part OP2 of the step region may be the same as or different from each other, and even when the widths are different from each other, the difference between the widths of the first overlapping part OP1 and the second overlapping part OP2 may be within a range of about 1 mm to about 15 mm.

The tandem solar cell 10 according to this embodiment is controlled so that the electrode portion 14*b* of the first overlapping part OP1 is connected only to the first electrode 42, so as to prevent shunting and stably realize the output of the solar cell.

The tandem solar cell module 100 according to some embodiments of the present disclosure utilizes the above tandem solar cells 10 to realize the solar cell module. The tandem solar cell module 100 is described in detail below with reference to FIG. 1 to FIG. 3.

In the solar cell module 100 according to some embodiments of the present disclosure, the plurality of tandem solar cells 10 are overlapped and stacked in a stepwise manner. For example, for a reference tandem solar cell 10, an adjacent upper tandem solar cell module 100 and an adjacent lower tandem solar cell module 100 partially overlap with the reference tandem solar cell 10, the upper tandem solar cell 10 partially overlaps with an upper portion of the reference tandem solar cell 10, and the lower tandem solar cell 10 partially overlap a lower portion of the reference tandem solar cell 10. For example, the first overlapping part OP1 of the reference tandem solar cell 10 and the second overlapping part OP2 of the upper tandem solar cell 10 overlap with each other, and the second overlapping part OP2 of the reference tandem solar cell 10 and the first overlapping part OP1 of the lower tandem solar cell 10 overlap with each other so as to be stacked in a stepwise manner.

That is, referring to FIG. 1, in the present disclosure, instead of arranging a plurality of tandem solar cells 10 spaced apart from each other, part of the tandem solar cells are successively overlapped and stacked, so that the light-receiving area can be maximized within the tandem solar cell module 100 of a predetermined area without an area for preventing electrical short circuiting, leakage, and the like. As a result, manufacturing output of the solar cell module can be improved.

Further, according to some embodiments of the present disclosure, the plate is formed at the first overlapping part OP1 overlapped during the modularization, thereby contributing to the output of the solar cell. That is, the first overlapping part OP1 is exposed as a light-receiving surface without being overlapped by the upper tandem solar cell 10 during the modularization, so the output of the solar cell according to the formation of the plate is lowered, and instead, the light-receiving area can be maximized within a solar cell module of a predetermined area.

In this specification, as described above, the upper tandem solar cell 10 and the lower tandem solar cell 10 respectively refer to, in the plurality of tandem solar cells 10 partially overlapped and arranged in a stepwise manner, the tandem solar cell 10 arranged at a relatively upper position and the tandem solar cell 10 arranged at a relatively lower position based on any tandem solar cell 10, and a same tandem solar cell 10 may be either the upper tandem solar cell 10 or the lower tandem solar cell 10 according to the tandem solar cell 10 used as a reference.

In the tandem solar cell module 100 according to some embodiments of the present disclosure, a connection member 14 is arranged between the second overlapping part OP2 of the adjacent upper tandem solar cell 10 and the first overlapping part OP1 of the lower tandem solar cell 10 so that the adjacent tandem solar cells 10 can be electrically and physically bonded.

Figure 3:
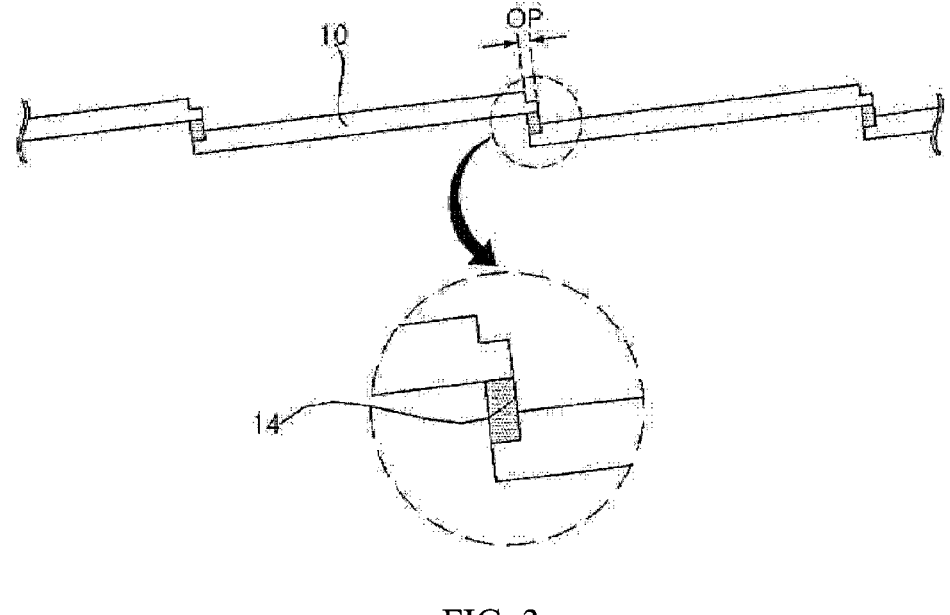
FIG. 3 is a sectional view of the solar cell module shown in FIG. 1.

In an embodiment, referring to FIG. 2 and FIG. 3, the connection member 14 may include a conductive adhesive portion 14*a* and an electrode portion 14*b*, and based on two adjacent tandem solar cells 10, the conductive adhesive portion 14*a* may be entirely arranged between the second overlapping part OP2 of the adjacent upper tandem solar cell 10 and the first overlapping part OP2 of the adjacent lower tandem solar cell 10. In this specification, "entirely arranged" includes not only a case where all are physically perfectly arranged in the region or space, but also a case where parts are inevitably partly excluded. The conductive adhesive portion 14*a* includes a polyblend of fluorine epoxy acrylate, silicon, and polyamide and has adhesion properties, and thus has conductive properties while being physically and stably bonded to the adjacent tandem solar cells 10, so as to play a role of electrically connecting the adjacent tandem solar cells 10. The conductive adhesive portion 14*a* may be composed of various materials, which may be composed of an electrical conductive adhesive (ECA) or the like as an example. However, the type of the conductive adhesive portion 14*a* is not limited to the content described, and as long as a conductive adhesive portion can be physically and electrically connected to the adjacent tandem solar cells 10, the conductive adhesive portion may be included in a range that can be easily selected by those of ordinary skill in the art.

In this case, the electrode portion 14*b* as a plate connected to the first electrode 42 may be entirely arranged on one side of the first overlapping part OP1 as a step region. The electrode portion 14*b* entirely arranged on one side of the first overlapping part OP1 may be formed to extend from the first conductive layer 422*a* constituting the first electrode 42.

As described above, the second electrode 44 formed at the second overlapping part OP2 of the upper tandem solar cell 10 and the electrode portion 14*b* formed at the first overlapping part OP1 of the lower tandem solar cell 10 are electrically connected through the conductive adhesive portion 14*a*, thereby constituting an electrical connection between two adjacent solar cells 10.

That is, the conductive adhesive portion 14*a* electrically connected to the second electrode 44 of the upper tandem solar cell 10 is in contact with the electrode portion 14*b* electrically connected to the first electrode 42 of the lower tandem solar cell 10, thereby enabling the upper tandem solar cell 10 and the lower tandem solar cell 10 to be electrically and physically connected.

Therefore, as described above, the tandem solar cell module 100 according to some embodiments of the present disclosure utilizes the connection member 14 to cause a plurality of tandem solar cells 10 to be overlapped and stacked in a stepwise manner, thereby improving productivity and reducing the defect rate.

The tandem solar cell module 100 according to some other embodiments of the present disclosure will be described below with reference to FIG. 8 to FIG. 11.

Figure 8:
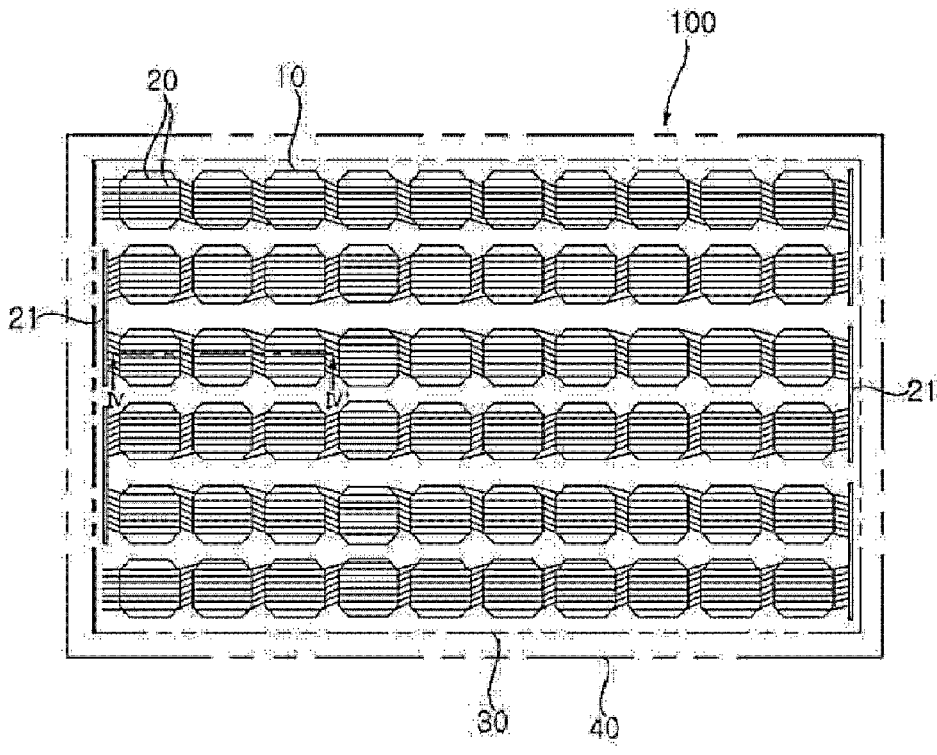
FIG. 8 is a plan view of a solar cell module according to some other embodiments of the present disclosure.
Figure 9:
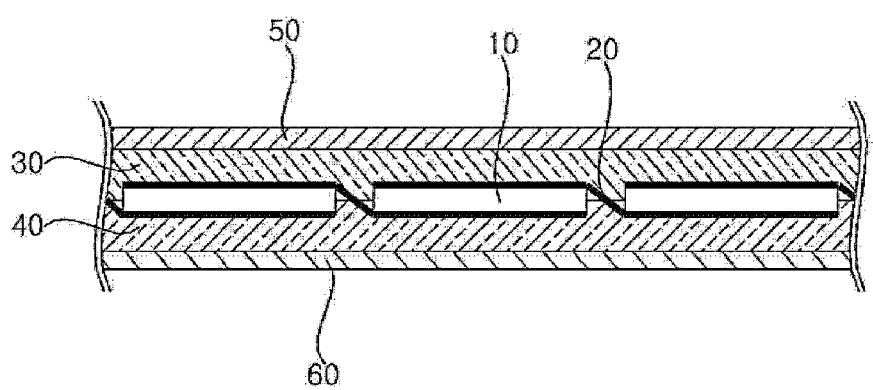
FIG. 9 is a sectional view of the solar cell module shown in FIG. 8 taking along line IV-IV'.
Figure 10:
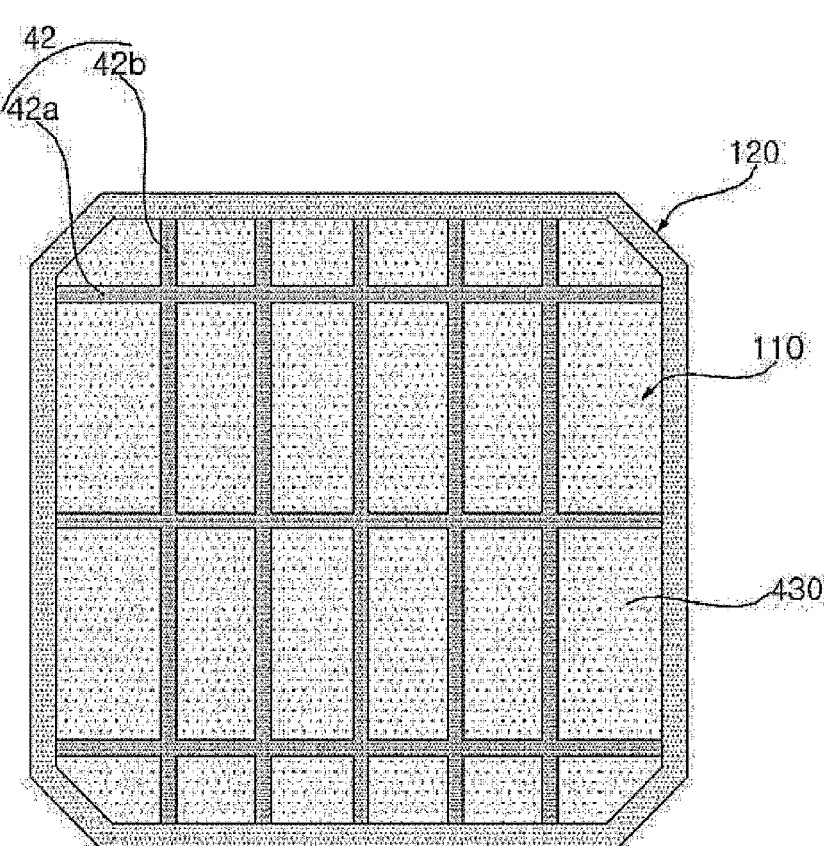
FIG. 10 is a plan view of a solar cell in the solar cell module shown in FIG. 8.
Figure 11:
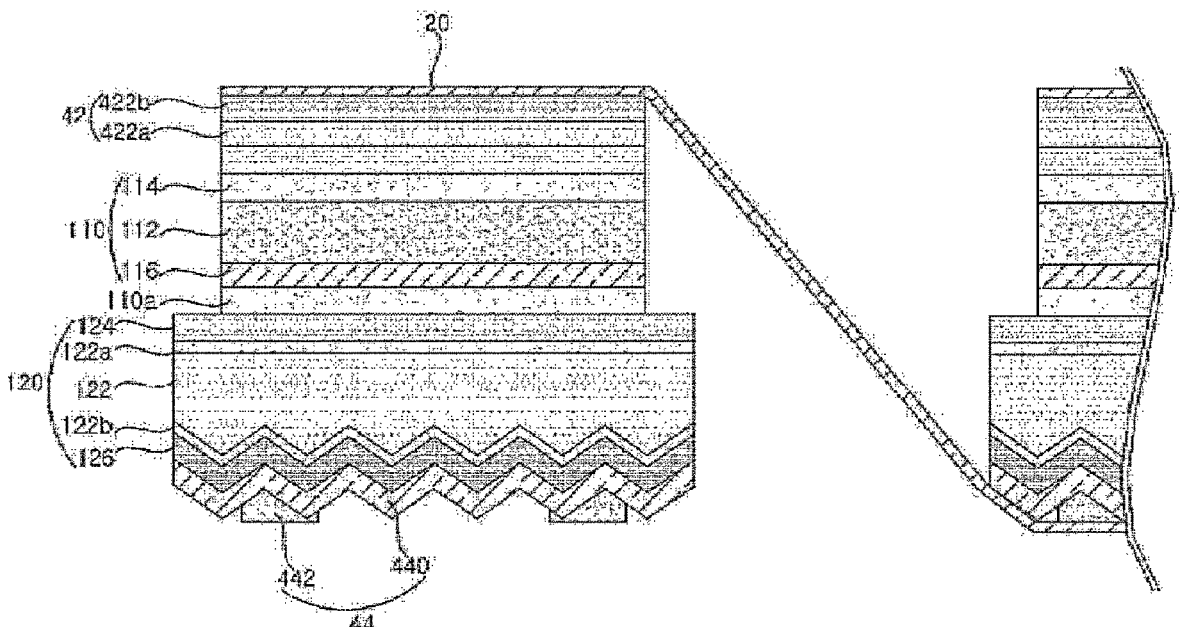
FIG. 11 is an enlarged sectional view of connections in the solar cell module shown in FIG. 10.

FIG. 8 is a plan view of a solar cell module according to some other embodiments of the present disclosure, FIG. 9 is a sectional view of the solar cell module shown in FIG. 8 taking along IV-IV', FIG. 10 is a plan view of a solar cell in the solar cell module shown in FIG. 8, and FIG. 11 is a sectional view of enlargement of connections in the solar cell module shown in FIG. 10.

Referring to FIG. 8 to FIG. 9, in the solar cell module 100 according to some other embodiments of the present disclosure, a plurality of tandem solar cells 10 are arranged in a matrix and are electrically connected to each other through wires 20.

The plurality of tandem solar cells 10 are connected in a row direction through the wires 20 and constitute a string, and a plurality of strings are connected to each other and constitute the solar cell module 100.

10 to 25 wires 20 connecting adjacent tandem solar cells 10 to each other can be used in order to optimize power generation efficiency of the solar cells in consideration of electrode and wire bonding, charge collection efficiency, and the like.

The wire 20 is in contact with the first electrode 42 formed on a front surface of a first solar cell of two adjacent tandem solar cells, and in addition, is in contact with the second electrode 44 formed on a back surface of a second solar cell adjacent to the first solar cell. Similarly, another wire 20 is in contact with the first electrode 42 of the second solar cell, and is in contact with the second electrode 44 of a third solar cell adjacent to the second solar cell. Therefore, the solar cells arranged in a string are connected in series by the wires 20.

Moreover, a bus ribbon 21 is connected to the wires 20 connected to one end of a first string and the wires 20 connected to one end of a second string. Similarly, another bus ribbon 21 connects the wires connected to the other end of the second string to the wires 20 connected to the other end of a third string. In this regard, all the tandem solar cells 10 constituting the solar cell module 100 are connected in series with each other. The solar cell module 100 thus connected is sealed by a front package 30 and a back package 40 for protection, and in a state of being arranged between a front substrate 50 and a back substrate 60, is laminated with the front substrate 50 and the back substrate 60 to realize integration.

The front substrate 50 is positioned as a front surface (a light-receiving surface where light enters) of the solar cell 10, and is made of a hard material without flexibility for impact protection. As an example, the front substrate 50 may be formed by tempered glass or the like having high transmittance and an excellent breakage prevention function.

The back substrate 60 is positioned as a back surface (a non-light-receiving surface where light does not enter) of the solar cell, and unlike the front substrate 50, is made of a flexible material. The back substrate 60 prevents penetration of moisture from the back, thereby protecting the solar cell from an external environment. The back substrate 40 may have a multilayer structure such as a layer for preventing penetration of moisture and oxygen and a layer for preventing chemical corrosion, and be formed into a thin sheet composed of an insulating material such as fluoropolymer (FP), polyester (PE), or fluoropolymer (FP).

The front package 30 is manufactured to have a thickness such that the wire 20 is completely buried so that the hard front substrate 50 is not physically impacted by the wire 20.

The back package 40 is located between the back substrate 60 and a back surface of the solar cell 10 and is made of a transparent material that transmits light. The back package 40 also uses an impact-absorbing resin product such as ethylene vinyl acetate (EVA) to prevent moisture penetration and protect the solar cell from impact. In addition, the back package 40 is constituted to include a material that absorbs ultraviolet light to prevent deterioration, whereas the front package 30 does not include an ultraviolet absorber and enables all light to be transmitted, so that development efficiency of the tandem solar cell 10 is good.

The plurality of tandem solar cells of the tandem solar cell module formed as described above may have a same configuration as that in FIG. 9 and FIG. 10.

Referring to FIG. 11, when the tandem solar cell 10 is described, the tandem solar cell has a same layered structure as the tandem solar cell in FIG. 4.

That is, a quantum-dot solar cell 10 according to another application example may further have a tandem structure including a first photoelectric conversion part 110 including a photoelectric conversion layer 112 including a perovskite compound and a second photoelectric conversion part 130 having a different material or structure from the first photoelectric conversion part 110. The solar cell 10 according to this embodiment also as a large-area solar cell may be formed into a large-area perovskite solar cell 10 with a diameter ranging from 10 cm to 20 cm, ranging from 12 cm to 17 cm in some embodiments.

A detailed layer structure is the same as that in FIG. 4, and thus is omitted.

In particular, the first photoelectric conversion part 110 including the photoelectric conversion layer 112 including the perovskite compound may be positioned on the junction layer 110a. The first photoelectric conversion part 110 may include a photoelectric conversion layer 112, a second transport layer (second carrier transport layer) 116 on one side of the photoelectric conversion layer 112 and between the junction layer 110a and the photoelectric conversion layer 112, and a first transport layer (first carrier transport layer) 114 on the other side of the photoelectric conversion layer 112 and between the photoelectric conversion layer 112 and the first electrode 42.

When light passes through the front surface of the solar cell 10 and is incident, the first photoelectric conversion part 110 absorbs short wavelengths to generate electrons and holes through photoelectric conversion. In this case, the first carriers (electrons as an example) move to the first electrode 42 side and are collected, and the second carriers (holes as an example) pass through the first photoelectric conversion part 110 and the second photoelectric conversion part 130, move to the second electrode 44, and are collected. When a long wavelength passing through but not used in the first photoelectric conversion part 110 reaches the second photoelectric conversion part 130, the second photoelectric conversion part 130 absorbs the long wavelength and generates electrons and holes through photoelectric conversion. In this case, the first carriers (electrons as an example) move to the first electrode 42 side through the first photoelectric conversion part 110 and are collected, and the second carriers (holes as an example) move to the second electrode 44 side and are collected.

As described above, in this application example, since light having various wavelengths can be used in the plurality of photoelectric conversion parts 110 and 120, the efficiency of the solar cell 10 can be greatly improved. In particular, in this embodiment, a variety of properties may be improved by including the first photoelectric conversion part 110 based on a perovskite compound and the second photoelectric conversion part 130 having a hetero junction structure. Since the first photoelectric conversion part 110 and the second photoelectric conversion part 130 above respectively have excellent open-circuit voltages, the efficiency of the solar cell 10 with a tandem structure can be greatly improved. A variety of structures are applicable to the second photoelectric conversion part 130, and the second photoelectric conversion part 120 may not be provided, but only the first photoelectric conversion part 110 is provided. A variety of other modifications are possible.

The first electrode 42 may include a first electrode layer 420 and a second electrode layer 422 sequentially stacked on the photoelectric conversion part 110, and the configuration has a same double-layer structure of the first conductive layer 422a by deposition and the second conductive layer 422b by printing as in FIG. 1.

In addition, the second electrode 44 may form an opening on the second photoelectric conversion part 130 and be in contact with the second conductive region 20.

The first electrode 42 and the second electrode 44 above may have a variety of planar shapes. As an example, the shape as shown in FIG. 9 is also possible, but the present disclosure is not limited thereto.

The first electrode 42 and the second electrode 44 may include a plurality of bus bar electrodes 42a and 44a spaced apart from each other while making the second electrode layers 422 and 442 respectively have a predetermined pitch. Although it is illustrated in the drawing that the bus bar electrodes 42a and 44a are parallel to each other and parallel to edges of the photoelectric conversion parts 110 and 120 (the semiconductor substrate 122 as an example), the present disclosure is not limited thereto. Moreover, the second electrode layers 422 and 442 may include bus bar electrodes 42b and 44b formed in a direction crossing the bus bar electrodes 42a and 44a and connected to the finger electrodes 42a and 44a.

The wires 20 pass over the plurality of bus bar electrodes 42a and 44a and are in electrical contact with the bus bar electrodes 42a and 44a.

In this case, a conductive adhesive film 15 may be arranged to enable the wire 20 to be contact with the bus bar electrodes 42a and 44a.

The conductive adhesive film 15 includes a polyblend of fluorine epoxy acrylate, silicon, and polyamide and has adhesion properties, and thus has conductive properties while being physically and stably bonded to the adjacent tandem solar cells 10, so as to play a role of electrically connecting the adjacent tandem solar cells 10. The conductive adhesive film 15 may be composed of various materials, which may be composed of an ECA or the like as an example. However, the type of the conductive adhesive film 15 is not limited to the content described, and as long as a conductive adhesive film can be physically and electrically connected to the adjacent tandem solar cells 10, the conductive adhesive film may be included in a range that can be easily selected by those of ordinary skill in the art.

In some embodiments, the bus bar electrodes 42a and 44a may be provided in plural while having a pitch larger than that between the finger electrodes 42b and 44b. In this case, widths of the bus bar electrodes 42a and 44a may be greater than those of the finger electrodes 42b and 44b, but the present disclosure is not limited thereto.

The above second electrode layers 422 and 442 of the first electrode 42 and the second electrode 44 may have planar shapes identical to or different from each other. The tandem solar cell module 100 according to some other embodiments of the present disclosure as described above may be simply attached to a plurality of tandem solar cells 10 through the wires 20, so a manufacturing process is simple, thereby improving productivity, and since configuration required for the module can be reduced, manufacturing costs can also be reduced.

The features, structures, effects, and the like above are included in at least one embodiment of the present disclosure, and are not necessarily limited to only one embodiment. In addition, the features, structures, effects, and the like exemplified in various embodiments can also be implemented by combining or modifying other embodiments by those skilled in the art to which the embodiments belong. Therefore, content related to such combinations and modifications should be construed as being included in the scope of the present disclosure.

REFERENCE SIGNS

100: solar cell module
10: solar cell
20: wire
110: first photoelectric conversion part
120: second photoelectric conversion part
110a: junction layer
42: first electrode
44: second electrode

What is claimed is:

1. A solar cell module, comprising:
a plurality of solar cells; and
a connection member connecting adjacent solar cells of the plurality of solar cells,
wherein each of the solar cells comprises:
a first photoelectric conversion part, wherein the first photoelectric conversion part comprises a photoelectric conversion layer containing a perovskite compound, a first transport layer on one side of the photoelectric conversion layer, and a second transport layer on the other side of the photoelectric conversion layer;
a second photoelectric conversion part, wherein the second photoelectric conversion part is arranged below the second transport layer of the first photoelectric conversion part, the second photoelectric conversion part has a larger area than the first photoelectric conversion part to form a step region in an edge region, and the second photoelectric conversion part has a material or structure different from that of the first photoelectric conversion part;
a first electrode, wherein the first electrode is electrically connected to the first photoelectric conversion part on one surface of the first photoelectric conversion part, and the one surface is a light-receiving surface; and
a second electrode, wherein the second electrode is electrically connected to a bottom of the second photoelectric conversion part,
wherein the first electrode has a stacking structure formed by a first electrode layer, a first conductive layer and a second conductive layer, and the second electrode is formed as a single layer, the first conductive layer is formed by deposition on the first electrode layer and the second conductive layer is formed by printing and firing a paste on the first conductive layer, and wherein each of the solar cells comprises an overlapping part overlapping with an adjacent solar cell in the edge region, wherein an overlapping part of each of the solar cells comprises an electrode portion connected to the respective first electrode, the electrode portion formed in the step region is integrally formed with the first conductive layer, and the second conductive layer is not formed in the step region, wherein the connection member comprises the electrode portion, the plurality of solar cells comprises a first solar cell and a second solar cell that are adjacent to each other, and the second electrode of the first solar cell is electrically connected to the electrode portion of the second solar cell by overlapping with the second solar cell, wherein the plurality of solar cells further comprises a third solar cell adjacent to the second solar cell, wherein along an arrangement direction of the plurality of solar cells, the first solar cell and the third solar cell are respectively located on two sides of the second solar cell, the overlapping part of the second solar cell comprises a first overlapping part overlapping with the first solar cell and a second overlapping part overlapping with the third solar cell, and the connection member comprises conductive adhesive portions respectively entirely arranged on step regions of the first overlapping part and the second overlapping part.

2. The solar cell module according to claim 1, wherein the electrode portion and the conductive adhesive portion are in contact with and electrically connected to each other.

3. The solar cell module according to claim 1, wherein the plurality of solar cells are spaced apart from each other, and the plurality of solar cells comprises a first solar cell and a second solar cell that are adjacent to each other, the connection member comprises a wiring connecting the first electrode of the third solar cell and the second electrode of the fourth solar cell.

4. The solar cell module according to claim 3, wherein the connection member further comprises a conductive adhesive film for connecting the first electrode and the wiring.

5. The solar cell module according to claim 1, wherein the first conductive layer is made of a metal, and the second conductive layer has a greater density than the first conductive layer.

6. The solar cell module according to claim 1, wherein the second photoelectric conversion part comprises a semiconductor substrate, a first conductive region provided over a front surface of the semiconductor substrate, and a second conductive region provided over a rear surface of the semiconductor substrate, and wherein a thickness of the photoelectric conversion layer is greater than a thickness of the first conductive region.

* * * * *